US006891215B2

(12) United States Patent
Moore et al.

(10) Patent No.: US 6,891,215 B2
(45) Date of Patent: May 10, 2005

(54) CAPACITORS

(75) Inventors: John T. Moore, Boise, ID (US); Scott J. DeBoer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/418,532

(22) Filed: Apr. 17, 2003

(65) Prior Publication Data

US 2003/0209778 A1 Nov. 13, 2003

Related U.S. Application Data

(62) Division of application No. 09/943,180, filed on Aug. 29, 2001.

(51) Int. Cl.⁷ .............................................. H01L 21/336
(52) U.S. Cl. .................. 257/298; 257/299; 257/300; 257/301; 257/302; 257/303; 257/304; 257/305; 257/306; 257/307; 257/308; 257/309; 257/310; 257/311; 257/312; 257/313; 257/239
(58) Field of Search ................................. 257/298–313, 257/239

(56) References Cited

U.S. PATENT DOCUMENTS

| | | |
|---|---|---|
| 3,627,598 A | 12/1971 | McDonald et al. |
| 4,254,161 A | 3/1981 | Kemlage |
| 4,262,631 A | 4/1981 | Kubacki |
| 4,435,447 A | 3/1984 | Ito et al. |
| 4,605,447 A | 8/1986 | Brotherton et al. |
| 4,882,649 A | 11/1989 | Chen et al. |
| 4,891,684 A | 1/1990 | Nishioka et al. |
| 4,980,307 A | 12/1990 | Ito et al. |
| 4,996,081 A | 2/1991 | Ellul et al. |
| 5,026,574 A | 6/1991 | Economu et al. |
| 5,032,545 A | 7/1991 | Doan et al. |
| 5,051,794 A | 9/1991 | Mori |
| 5,142,438 A | 8/1992 | Reinberg et al. |
| 5,164,331 A | 11/1992 | Lin et al. |
| 5,227,651 A | 7/1993 | Kim et al. |
| 5,237,188 A | 8/1993 | Iwai et al. |
| 5,254,489 A | 10/1993 | Nakata |
| 5,258,333 A | 11/1993 | Shappir et al. |
| 5,318,924 A | 6/1994 | Lin et al. |
| 5,324,679 A | 6/1994 | Kim et al. |
| 5,330,920 A | 7/1994 | Soleimani et al. |
| 5,330,936 A | 7/1994 | Ishitani |

(Continued)

FOREIGN PATENT DOCUMENTS

| | | |
|---|---|---|
| EP | 0 886 308 A2 | 6/1998 |
| WO | WO 96/39713 | 6/1996 |

OTHER PUBLICATIONS

Doyle et al., *Simultaneous Growth of Different Thickness Gate Oxides in Silicon CMOS Processing*, IEEE 16 Electron Device Letters, No. 7, pp. 301–302 (Jul. 1995).

(Continued)

*Primary Examiner*—Matthew Smith
*Assistant Examiner*—Victor V Yevsikov
(74) *Attorney, Agent, or Firm*—Wells St. John P.S.

(57) ABSTRACT

A method of forming a capacitor includes forming first and second capacitor electrodes over a substrate. A capacitor dielectric region is formed intermediate the first and second capacitor electrodes, and includes forming a silicon nitride comprising layer over the first capacitor electrode. A silicon oxide comprising layer is formed over the silicon nitride comprising layer. The silicon oxide comprising layer is exposed to an activated nitrogen species generated from a nitrogen-containing plasma effective to introduce nitrogen into at least an outermost portion of the silicon oxide comprising layer. Silicon nitride is formed therefrom effective to increase a dielectric constant of the dielectric region from what it was prior to said exposing. Capacitors and methods of forming capacitor dielectric layers are also disclosed.

9 Claims, 6 Drawing Sheets

U.S. PATENT DOCUMENTS

| | | |
|---|---|---|
| 5,334,554 A | 8/1994 | Lin et al. |
| 5,350,707 A | 9/1994 | Ko et al. |
| 5,376,593 A | 12/1994 | Sandhu et al. |
| 5,378,645 A | 1/1995 | Inoue et al. |
| 5,382,533 A | 1/1995 | Ahmad et al. |
| 5,393,702 A | 2/1995 | Yang et al. |
| 5,397,748 A | 3/1995 | Watanabe et al. |
| 5,398,641 A | 3/1995 | Shih |
| 5,436,481 A | 7/1995 | Egawa et al. |
| 5,445,999 A | 8/1995 | Thakur et al. |
| 5,449,631 A | 9/1995 | Giewont et al. |
| 5,459,105 A | 10/1995 | Matsuura |
| 5,464,792 A | 11/1995 | Tseng et al. |
| 5,498,890 A | 3/1996 | Kim et al. |
| 5,500,380 A | 3/1996 | Kim |
| 5,504,029 A | 4/1996 | Murata et al. |
| 5,508,542 A | 4/1996 | Geiss et al. |
| 5,518,946 A | 5/1996 | Kuroda |
| 5,518,958 A | 5/1996 | Giewont et al. |
| 5,523,596 A | 6/1996 | Ohi et al. |
| 5,596,218 A | 1/1997 | Soleimani et al. |
| 5,612,558 A | 3/1997 | Harshfield |
| 5,619,057 A | 4/1997 | Komatsu |
| 5,620,908 A | 4/1997 | Inoh et al. |
| 5,633,036 A | 5/1997 | Seebauer et al. |
| 5,663,077 A | 9/1997 | Adachi et al. |
| 5,674,788 A | 10/1997 | Wristers et al. |
| 5,685,949 A | 11/1997 | Yashima |
| 5,716,864 A | 2/1998 | Abe |
| 5,719,083 A | 2/1998 | Komatsu |
| 5,731,235 A | 3/1998 | Srinvasan et al. |
| 5,760,475 A | 6/1998 | Cronin et al. |
| 5,763,922 A | 6/1998 | Chau |
| 5,821,142 A | 10/1998 | Sung et al. |
| 5,834,372 A | 11/1998 | Lee |
| 5,837,592 A | 11/1998 | Chang et al. |
| 5,837,598 A | 11/1998 | Aronowitz et al. |
| 5,840,610 A | 11/1998 | Gilmer et al. |
| 5,844,771 A | 12/1998 | Graettinger et al. |
| 5,851,603 A | 12/1998 | Tsai et al. |
| 5,861,651 A | 1/1999 | Brasen et al. |
| 5,885,877 A | 3/1999 | Gardner et al. |
| 5,939,750 A | 8/1999 | Early |
| 5,960,289 A | 9/1999 | Tsui et al. |
| 5,960,302 A | 9/1999 | Ma et al. |
| 5,970,345 A | 10/1999 | Hattangady et al. |
| 5,972,783 A | 10/1999 | Arai et al. |
| 5,972,800 A | 10/1999 | Hasegawa |
| 5,994,749 A | 11/1999 | Oda |
| 5,998,253 A | 12/1999 | Loh et al. |
| 6,001,748 A | 12/1999 | Tanaka |
| 6,008,104 A | 12/1999 | Schrems |
| 6,033,998 A | 3/2000 | Aronowitz et al. |
| 6,054,396 A | 4/2000 | Doan |
| 6,057,220 A | 5/2000 | Ajmera et al. |
| 6,080,629 A | 6/2000 | Gardner et al. |
| 6,080,682 A | 6/2000 | Ibok |
| 6,087,229 A | 7/2000 | Aronowitz et al. |
| 6,091,109 A | 7/2000 | Hasegawa |
| 6,091,110 A | 7/2000 | Hebert et al. |
| 6,093,661 A | 7/2000 | Trivedi et al. |
| 6,096,597 A | 8/2000 | Tsu et al. |
| 6,110,780 A | 8/2000 | Yu et al. |
| 6,110,842 A | 8/2000 | Okuno et al. |
| 6,114,203 A | 9/2000 | Ghidini et al. |
| 6,136,636 A | 10/2000 | Wu |
| 6,140,187 A | 10/2000 | DeBusk et al. |
| 6,146,948 A | 11/2000 | Wu et al. |
| 6,174,821 B1 | 1/2001 | Doan |
| 6,184,110 B1 | 2/2001 | Ono et al. |
| 6,197,701 B1 | 3/2001 | Shue et al. |
| 6,201,303 B1 | 3/2001 | Ngo et al. |
| 6,207,532 B1 | 3/2001 | Lin et al. |
| 6,207,586 B1 | 3/2001 | Ma et al. |
| 6,207,985 B1 | 3/2001 | Walker |
| 6,225,167 B1 | 5/2001 | Yu et al. |
| 6,228,701 B1 | 5/2001 | Dehm et al. |
| 6,232,244 B1 | 5/2001 | Ibok |
| 6,255,703 B1 | 7/2001 | Hause et al. |
| 6,265,327 B1 | 7/2001 | Kobayashi et al. |
| 6,268,296 B1 | 7/2001 | Misium et al. |
| 6,274,442 B1 | 8/2001 | Gardner et al. |
| 6,297,162 B1 | 10/2001 | Jang et al. |
| 6,323,114 B1 | 11/2001 | Hattangady et al. |
| 6,331,492 B2 | 12/2001 | Misium et al. |
| 6,350,707 B1 * | 2/2002 | Liu et al. ............ 438/791 |
| 6,362,085 B1 | 3/2002 | Yu et al. |
| 6,399,445 B1 | 6/2002 | Hattangady et al. |
| 6,399,448 B1 | 6/2002 | Mukhopadhyay et al. |
| 6,410,991 B1 | 6/2002 | Kawai et al. |
| 6,413,881 B1 | 7/2002 | Aronowitz et al. |
| 6,436,771 B1 | 8/2002 | Jang et al. |
| 6,450,116 B1 | 9/2002 | Noble et al. |
| 6,482,690 B2 | 11/2002 | Shibata |
| 6,492,690 B2 | 12/2002 | Ueno et al. |
| 2003/0034518 A1 | 2/2003 | Yoshikawa |

OTHER PUBLICATIONS

Ko et al., *The Effect of Nitrogen Incorporation into the Gate Oxide by Using Shallow Implantation of Nitrogen and Drive–in Process*, IEEE, pp. 32–35 (1996).

Kuroi et al., *The Effects of Nitrogen Implantation Into P+ Poly–Silicon Gate on Gate Oxide Properties*, IEEE Symposium on VLSI Technology Digest of Technical Papers, pp. 107–108 (1994).

Liu et al., *Multiple Gate Oxide Thickness for 2GHz System–on–a–Chip Technologies*, IEEE, pp. 589–592 (1998).

Wolf, Silicon Processing for the VLSI Era, vol. 2: Process Integration, pp. 188, 189, 194, 195, 609–614, (Lattice Press 1990).

Wolf, Silicon Processing for the VLSI Era, vol. 2: Process Integration, pp. 212–213 (Lattice Press 1990).

Wolf, Silicon Processing for the VLSI Era, vol. 3: Submicron MOSFET, pp. 648–649 (Lattice Press 1995).

U.S. Appl. No. 09/633,556, filed Aug. 2000, Sandhu et al.

* cited by examiner

CAPACITORS

This patent resulted from a divisional application of U.S. patent application Ser. No. 09/943,180, filed Aug. 29, 2001, entitled "Methods of Forming Capacitors", naming John T. Moore and Scott J. DeBoer as inventors, the disclosure of which is incorporated by reference.

TECHNICAL FIELD

This invention relates capacitors, to methods of forming capacitors and to methods of forming capacitor dielectric layers.

BACKGROUND OF THE INVENTION

Capacitors are commonly-used electrical components in semiconductor circuitry, for example in DRAM circuitry. As integrated circuitry density increases, there is a continuing challenge to maintain sufficiently high storage capacitance despite decreasing capacitor area. A typical capacitor is comprised of two conductive electrodes separated by a non-conducting dielectric region. The dielectric region is preferably comprised of one or more materials preferably having a high dielectric constant and low leakage current characteristics. Example materials include silicon oxides, such as $SiO_2$, and $Si_3N_4$. $Si_3N_4$ is typically preferred due to its higher dielectric constant than $SiO_2$.

Numerous capacitor dielectric materials have been and are being developed in an effort to meet the increasing stringent requirements associated with the production of smaller and smaller capacitor devices used in higher density integrated circuitry. Most of these materials do, however, add increased process complexity or cost over utilization of conventional $SiO_2$ and $Si_3N_4$ capacitor dielectric materials.

One dielectric region in use today includes a composite of silicon oxide and silicon nitride layers. Specifically, a first capacitor electrode is formed to have a silicon oxide comprising layer, typically silicon dioxide, of 6 to 10 Angstroms thereover. Such might be formed by deposition, or more typically by ambient or native oxide formation due to oxidation of the first electrode material (for example conductively doped polysilicon) when exposed to clean room ambient atmosphere. Thereafter, a silicon nitride layer is typically deposited by low pressure chemical vapor deposition. This can, however, undesirably produce very small pinholes in the silicon nitride layer, particularly with thin layers of less than 200 Angstroms, with the pinholes becoming particularly problematic in layers of less than or equal to about 75 Angstroms thick. These pinholes can undesirably reduce film density and result in undesired leakage current in operation.

One technique for filling such pinholes is to oxidize the substrate in a manner which fills such pinholes with silicon oxide material. For example, one such manner where the lower electrode material comprises silicon is to expose the substrate to suitable oxidizing conditions to cause silicon from the electrode and silicon from the silicon nitride to oxidize. Such forms silicon oxide material which thereby completely fills the pinholes and forms a silicon oxide layer typically from about 5 Angstroms to about 25 Angstroms thick over the silicon nitride. Wet oxidation conditions are typically used.

A second capacitor electrode is ultimately formed thereover, with the dielectric region in such example comprising an oxide-nitride-oxide composite. Typically achieved dielectric constant for such a capacitor dielectric region is about 5. Higher dielectric constant capacitor dielectric regions are of course desired, and it would be desirable to provide methods which enable utilization of silicon nitride and/or silicon oxide material dielectric regions if practical.

The invention was primarily motivated in improving dielectric constant of silicon nitride comprising capacitor dielectric layers having pinholes formed therein which are filled with silicon oxide material. However the invention is in no way so limited as will be appreciated by the artisan, with the invention only being limited by the accompanying claims as literally worded without narrowing reference to the specification, and in accordance with the doctrine of equivalents.

SUMMARY

The invention includes capacitors, methods of forming capacitors and methods of forming capacitor dielectric layers. In one implementation, a method of forming a capacitor includes forming first and second capacitor electrodes over a substrate. A capacitor dielectric region is formed intermediate the first and second capacitor electrodes, and includes forming a silicon nitride comprising layer over the first capacitor electrode. A silicon oxide comprising layer is formed over the silicon nitride comprising layer. The silicon oxide comprising layer is exposed to an activated nitrogen species generated from a nitrogen-containing plasma effective to introduce nitrogen into at least an outermost portion of the silicon oxide comprising layer. Silicon nitride is formed therefrom effective to increase a dielectric constant of the dielectric region from what it was prior to said exposing.

In one implementation, a method of forming a capacitor dielectric layer includes forming a silicon nitride comprising layer over a substrate. An outer silicon oxide comprising layer is formed over the silicon nitride comprising layer. The substrate is provided with the silicon nitride and the silicon oxide comprising layers within a plasma deposition chamber. The chamber includes a substrate receiver and a powerable electrode spaced therefrom, and the substrate is received by the receiver. A spacing between the receiver and the electrode of at least 0.1 inch is provided, with the substrate being received on the receiver. With such spacing, a nitrogen comprising gas is injected to within the chamber and with the electrode generating a plasma therefrom effective to form an activated nitrogen species which diffuses into the outer silicon oxide comprising layer. Silicon nitride is formed therefrom in only an outermost portion of the silicon oxide comprising layer.

In one implementation, a capacitor includes first and second capacitor electrodes. A capacitor dielectric region is received intermediate the first and second capacitor electrodes. The capacitor dielectric region includes a silicon nitride comprising layer having an outermost surface which contacts the second capacitor electrode. The outermost surface consists essentially of silicon nitride. The silicon nitride comprising layer has a plurality of pinholes therein which are at least partially filled with silicon oxide material which is spaced from the second electrode.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
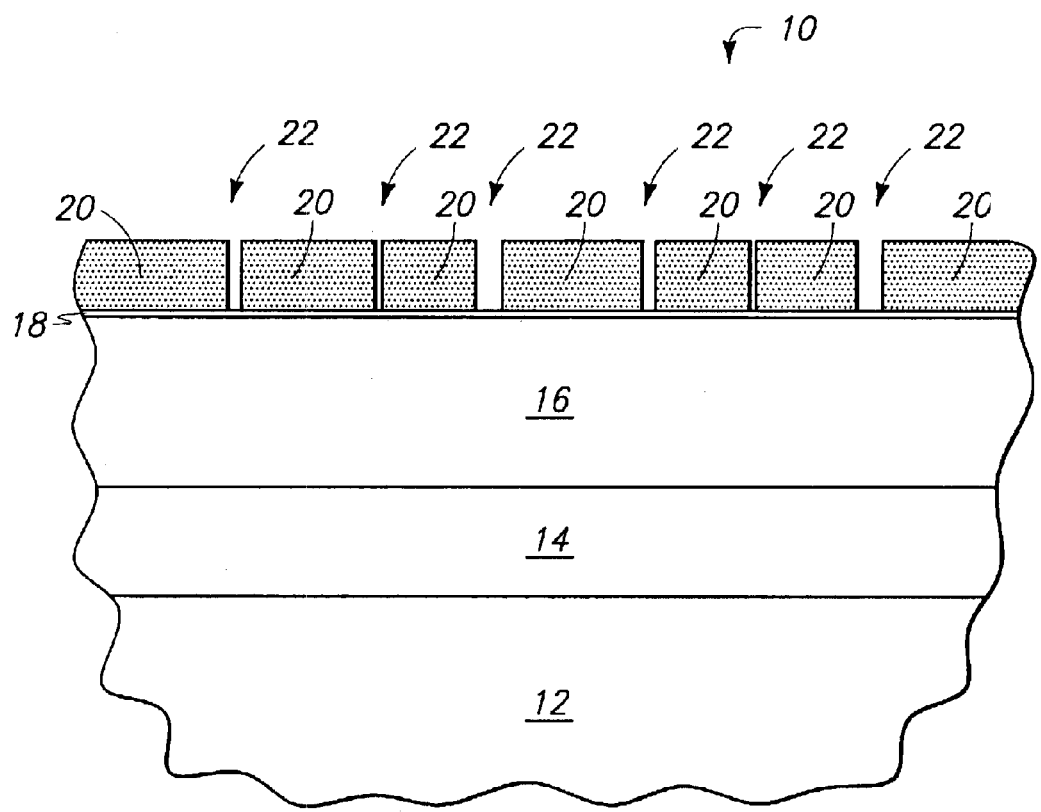
FIG. 1 is a diagrammatic sectional view of a semiconductor wafer fragment in process in accordance with an aspect of the invention.

This disclosure of the invention is submitted in furtherance of the constitutional purposes of the U.S. Patent Laws "to promote the progress of science and useful arts" (Article 1, Section 8).

A wafer fragment in process in accordance with a method of forming a capacitor in accordance with an aspect of the invention is indicated generally with reference numeral 10. Such comprises a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies, comprising other materials). The term "substrate" refers to any supporting structure, including, but not limited to, the semiconductive substrates described above. An insulative layer 14, for example doped or undoped silicon dioxide, or silicon nitride, is formed over bulk substrate 12.

A first capacitor electrode material 16 is formed over insulative layer 14. At this point, or preferably later in the process, electrode material 16 is ultimately patterned/provided into some desired first capacitor electrode shape. Exemplary materials for electrode 16 include silicon (for example polysilicon) metals, conductive metal oxides, and any other conductive layer or layers. An exemplary thickness in one preferred embodiment, and particularly where layer 16 comprises polysilicon, is 600 Angstroms. A first or inner silicon oxide comprising layer 18 is formed over, and "on" as shown, first capacitor electrode 16. An exemplary method for forming layer 18 is by oxidizing an outer portion of electrode material 16, for example by exposure to clean room ambient. This oxide layer is not preferred, but rather an effect of an exposed silicon or other oxidizable substrate. Typical thickness for layer 18 is less than or equal to 15 Angstroms. Layer 18 preferably consists essentially of silicon dioxide.

A silicon nitride comprising layer 20 is formed over first capacitor electrode 16 and in the illustrated preferred embodiment is formed on first or inner silicon oxide comprising layer 18. An exemplary thickness is from 30 Angstroms to 80 Angstroms. In but one embodiment, silicon nitride comprising layer 20 is formed to have a plurality of pinholes 22 formed therein. Such are shown in exaggerated width in the figures for clarity. In the illustrated embodiment, at least some pinholes extend completely through layer 20 to silicon oxide comprising layer 18. Silicon nitride comprising layer 20 might be deposited by any existing or yet-to-be developed technique, with chemical vapor deposition or plasma enhanced chemical vapor deposition being but examples. One exemplary process whereby a silicon nitride layer 20 is deposited by chemical vapor deposition includes $NH_3$ at 300 sccm, dichlorosilane at 100 sccm, 750 mTorr, 600° C., and 60 minutes of processing.

Figure 2:
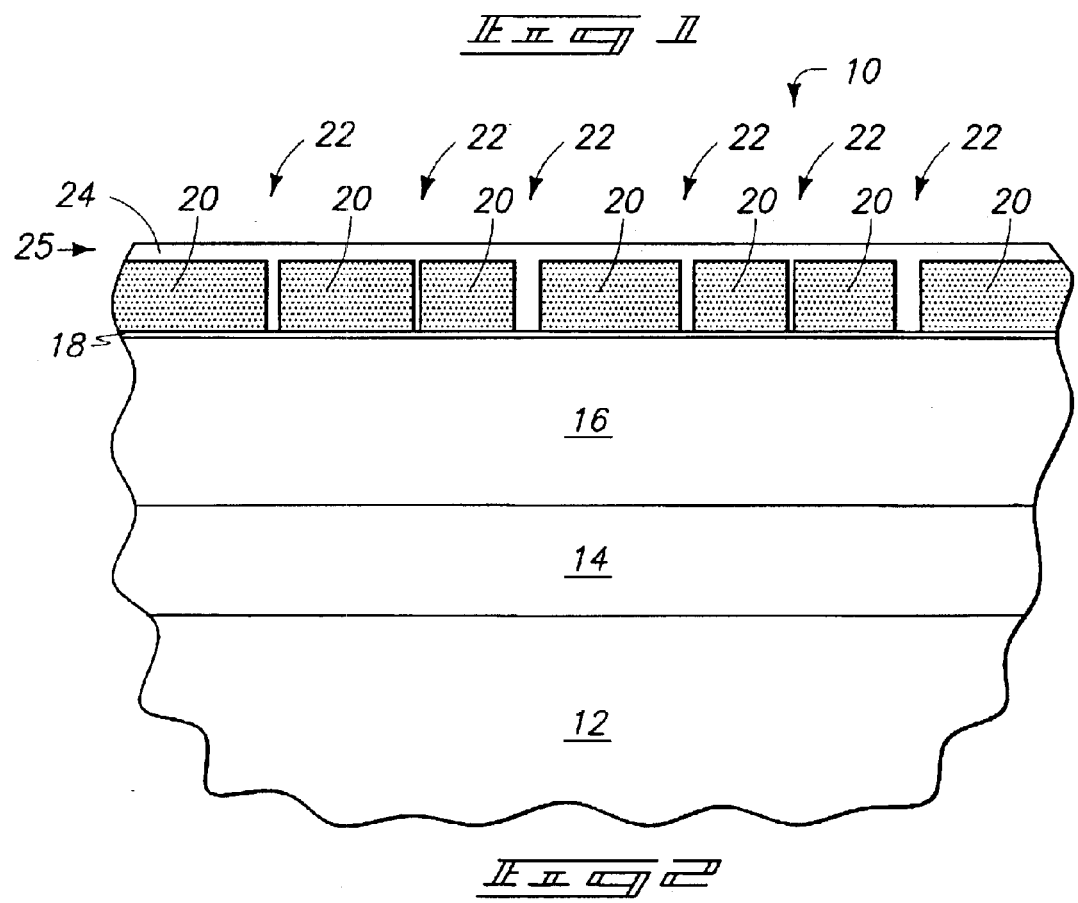
FIG. 2 is a view of the FIG. 1 wafer fragment at a processing step subsequent to that shown by FIG. 1.

Referring to FIG. 2, a second or outer silicon oxide comprising layer 24 is formed over silicon nitride comprising layer 20, and as shown in the preferred embodiment is formed thereon. In one preferred embodiment, and where silicon nitride comprising layer 20 includes pinholes, silicon oxide comprising layer 24 is formed effective to fill such pinholes with silicon oxide, as shown. Such preferably occurs by an oxidation. One example method of forming silicon oxide comprising layer 24 is to oxidize the substrate effective to both fill said pinholes with silicon oxide derived from at least some silicon of the first capacitor electrode material and form such second silicon oxide comprising layer 24 on silicon nitride comprising layer 20 thereover from at least some silicon of the silicon nitride material. By way of example only, exemplary oxidation conditions include 800° C., 5 slpm $H_2$, 10 slpm $O_2$, at atmospheric pressure for 15 minutes. For purposes of the continuing discussion, second silicon oxide comprising layer 24 upon formation includes a portion 25 which is everywhere received elevationally over silicon nitride comprising layer 20, and which is outside of pinholes 22. An exemplary thickness for portion 25 is from 5 Angstroms to 25 Angstroms.

Figure 3:
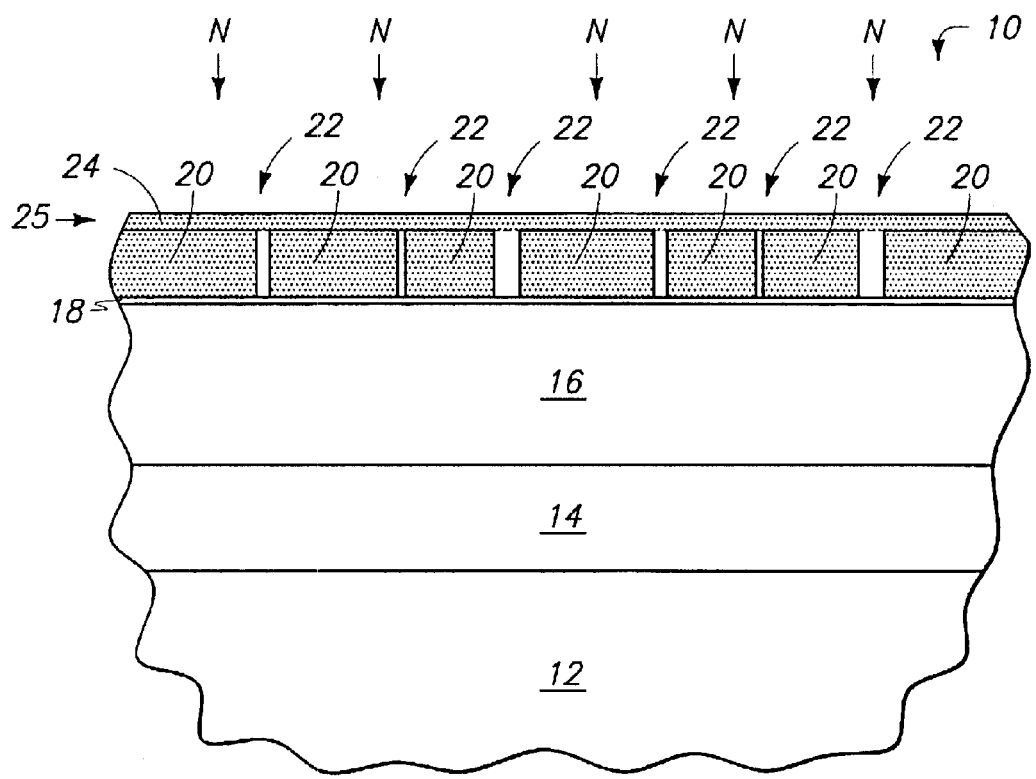
FIG. 3 is a view of the FIG. 2 wafer fragment at a processing step subsequent to that shown by FIG. 2.
Figure 4:
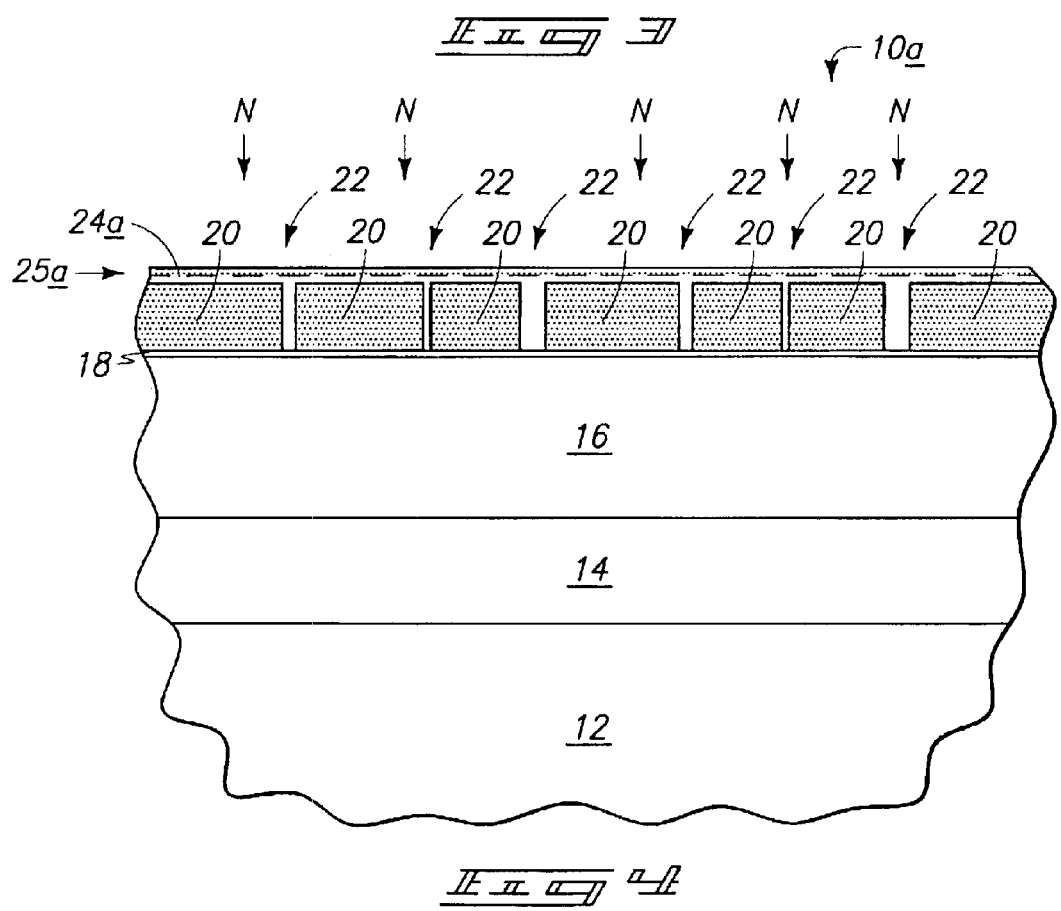
FIG. 4 is an alternate view of the FIG. 2 wafer fragment at a processing step subsequent to that shown by FIG. 2.
Figure 5:
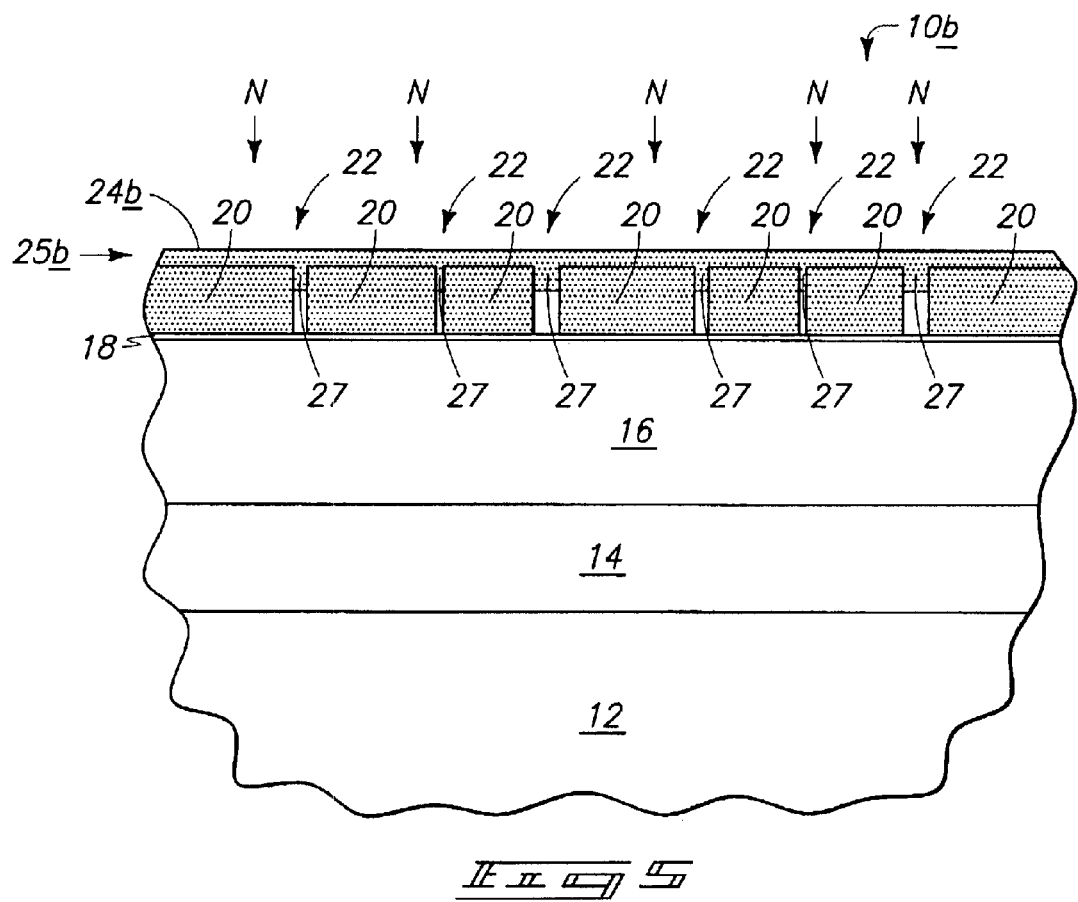
FIG. 5 is another alternate view of the FIG. 2 wafer fragment at a processing step subsequent to that shown by FIG. 2.

The silicon oxide comprising layer is exposed to an activated nitrogen species generated from a nitrogen-containing plasma effective to introduce nitrogen into at least an outermost portion of the silicon oxide comprising layer, and silicon nitride is formed therefrom. By way of example only, FIGS. 3, 4 and 5 illustrate different exemplary embodiments of the same where the silicon nitride comprising layer includes pinholes formed therein. FIG. 3 depicts wafer fragment embodiment 10, FIG. 4 an embodiment 10a, and FIG. 5 an embodiment 10b. Like numerals from the first described embodiments are utilized in FIGS. 4 and 5, with differences being indicated by different numerals or by "a" or "b" suffixes, respectively. In each of the depicted preferred embodiments, the exposing and forming of silicon nitride therefrom transforms only an outermost portion of the second silicon oxide comprising layer to silicon nitride. Alternately in accordance with an aspect of the invention, the entirety of a silicon oxide comprising layer received over a silicon nitride comprising layer might be transformed to silicon nitride.

Transformation of the respective illustrated portions of former silicon oxide comprising layer 24 ultimately to silicon nitride is depicted by the stippling intended to show the transformation to silicon nitride. For example, FIG. 3 depicts all of portion 25 of silicon oxide comprising layer 24 as being transformed to silicon nitride. FIG. 4 depicts an embodiment wherein only an outermost part of portion 25a is ultimately transformed to silicon nitride. The FIG. 4 embodiment shows approximately half of portion 25a being transformed to silicon nitride. Of course, more or less of portion 25 might alternately be transformed in connection with the FIG. 4 embodiment. In FIG. 5, the exposing and forming silicon nitride therefrom was also effective to transform an outermost portion 27 of the silicon oxide material within the pinholes to silicon nitride. Such depicts an approximate outermost portion constituting roughly one-third of the pinhole depth in FIG. 5, although more or less transformation of the subject silicon oxide material within the pinholes might be transformed in accordance with the FIG. 5 and similar embodiments. In each of the preferred FIGS. 3–5 embodiments, at least some silicon oxide remains within the previously formed pinholes, with the embodiments of FIGS. 3 and 4 depicting processing whereby no silicon nitride is formed within pinholes 22.

Figure 6:
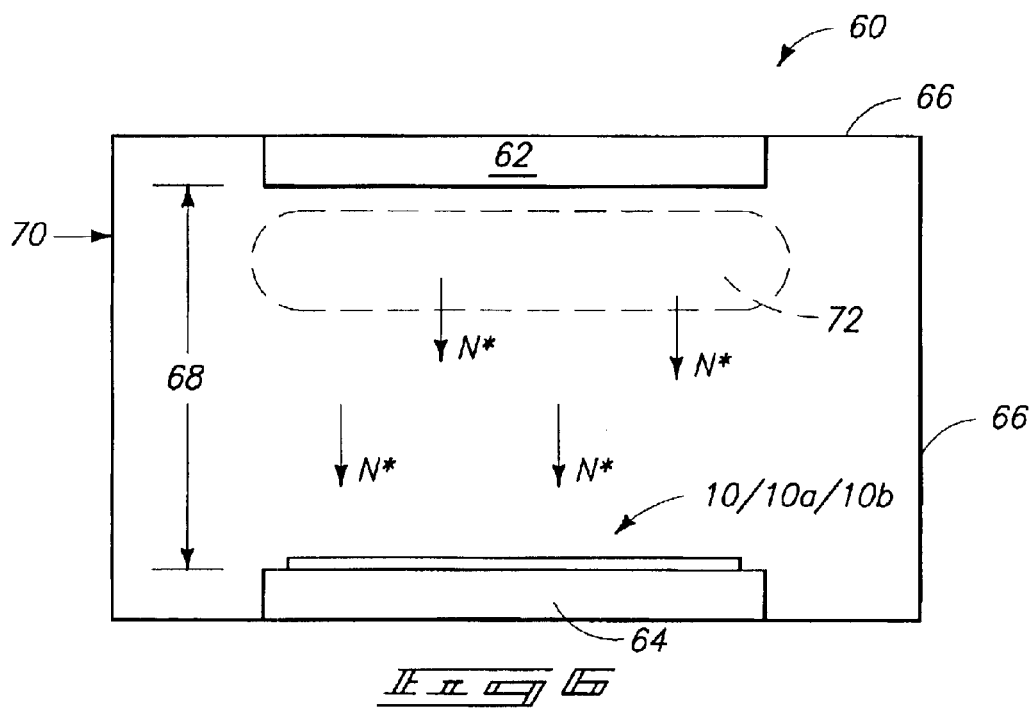
FIG. 6 is a diagrammatic view of a plasma deposition chamber usable in accordance with an aspect of the invention.

Exemplary preferred processing by which such exposing and transformation to silicon nitride occurs is as described in U.S. patent application Ser. No. 09/633,556 filed Aug. 7, 2000, entitled "Transistor Structures, Methods of Incorporating Nitrogen Into Silicon-Oxide-Containing Layers, and Methods of Forming Transistors", listing Gurtej S. Sandhu, John T Moore and Neil R. Rueger as inventors, and which is herein fully incorporated by reference. One preferred process for effecting the exposing and formation of silicon nitride is described with reference to FIG. 6. Such diagrammatically depicts a plasma deposition chamber 60. Such preferably constitutes a single wafer processor comprising a powerable electrode 62 and a wafer receiver or chuck 64. Receiver 64 might be heated or cooled from an appropriate power source. Receiver 64 and electrode 62 are received within chamber walls 66. By way of example only, an exemplary such reactor would be a high density plasma chamber from Applied Materials. Electrode 62 and receiver 64 are spaced from one another by a depicted distance 68. Typically and preferably, such spacing is adjustable by the operator. In one preferred embodiment, substrate 10 of FIG. 2 is provided within chamber 60 received by receiver 64.

Nitrogen is injected to within chamber 60, for example from one or more injection ports 70, and with electrode 62 a plasma 72 is generated therefrom effective to form the activated nitrogen species. In one most preferred embodiment, generated plasma 72 is spaced from the outer silicon oxide comprising layer of substrate 10. Such is preferably accomplished by the control of spacing 68 and the powering of electrode 62 to, in the preferred embodiment, preclude plasma 72 from directly being exposed to the outer surface of substrate 10. One reason for preferably avoiding direct plasma exposure is to avoid possible plasma damage to underlying devices. The illustrated plasma 72 constitutes an exemplary remote plasma, wherein the actual plasma species is not provided directly in contact with substrate 10. Plasma generation outside of the chamber could also be utilized to generate the activated nitrogen. Preferred spacing 68 is at least 0.1 inch, more preferably at least 1.0 inch, still more preferably at least 2.0 inches, and even more preferably at least 4.0 inches. Exemplary preferred nitrogen gasses include one or more of $N_2$, $NH_3$ and $NO_x$. Other exemplary processing parameters are as described in U.S. patent application Ser. No. 09/633,556 referred to above. In one preferred embodiment, the activated nitrogen species diffuses into the outer silicon oxide comprising layer 24, and silicon nitride is formed therefrom in only an outermost portion of the silicon oxide comprising layer.

Preferably, the electrode is powered at anywhere from 100 to 3000 watts, with an exemplary preferred pressure range during the processing being, for example, from 10 mTorr to 1 Torr. Chuck temperature is preferably maintained from, for example, room temperature to about 900° C. Preferred exposure times include from 5 seconds to 60 seconds.

The formation of silicon nitride therefrom might occur during such exemplary exposing. Alternately, such might occur afterward from conventional subsequent wafer processing involving thermal exposure of the substrate, or by a dedicated thermal annealing step. For example and by way of example only, if wafer receiver 64 is maintained at a temperature of around 800° C. or higher during the exposing, silicon nitride may inherently form during such exposing by the act of nitrogen diffusion into layer 24. Alternately by way of example only and if processing at lower temperatures, silicon nitride might subsequently be formed from the diffused nitrogen species by thermally annealing the substrate at a temperature of at least 600° C. after the exposing for some suitable period of time to effect silicon nitride transformation.

Figure 7:
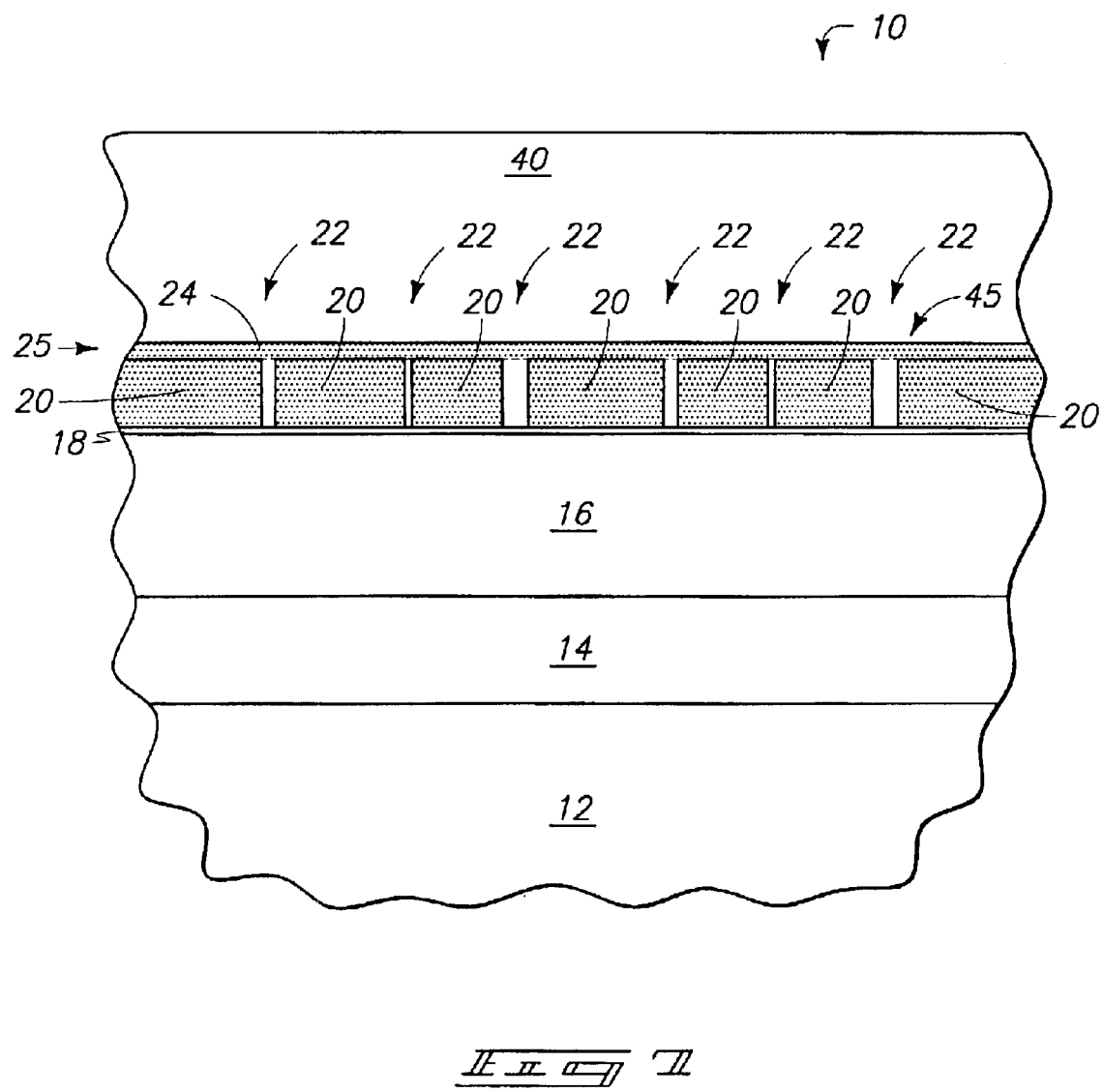
FIG. 7 is a view of the FIG. 3 wafer fragment at a processing step subsequent to that shown by FIG. 3.
Figure 8:
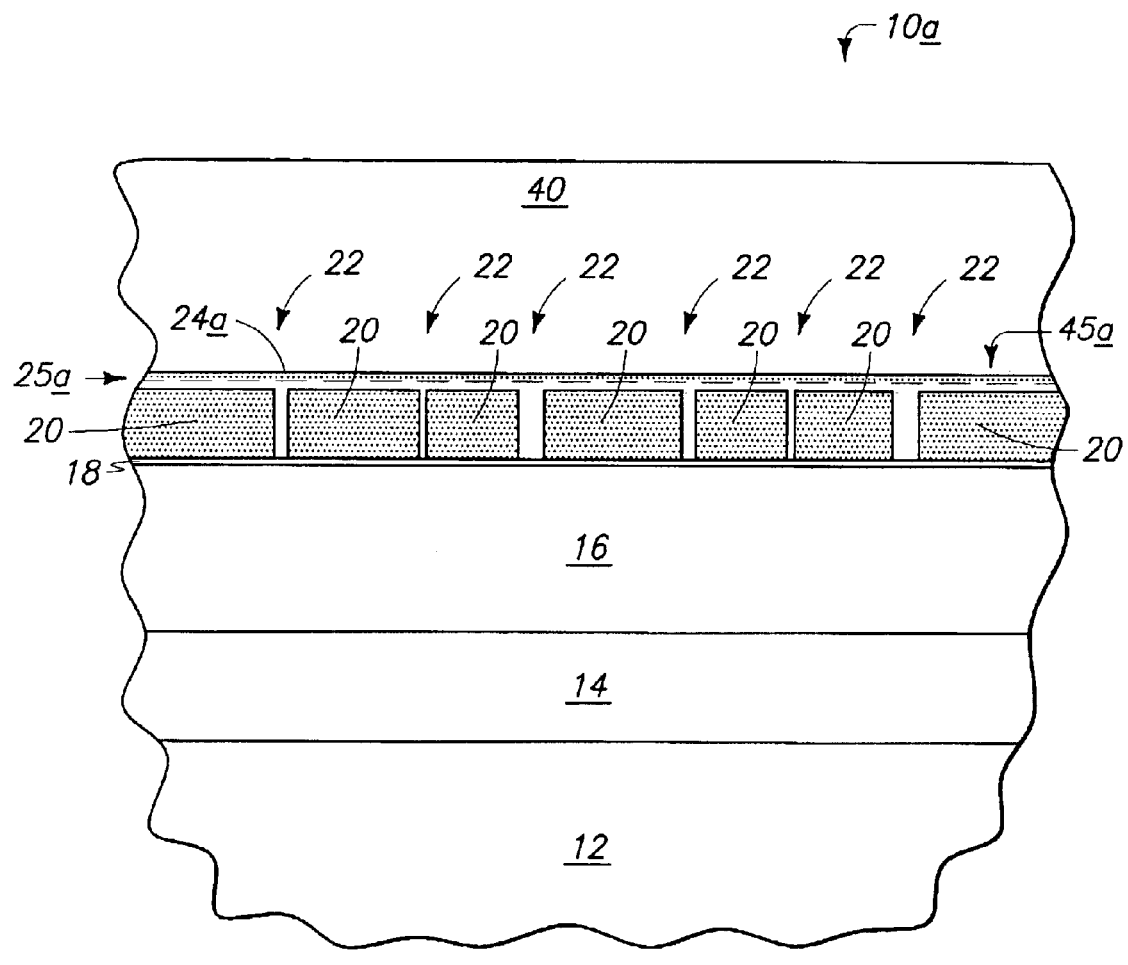
FIG. 8 is a view of the FIG. 4 wafer fragment at a processing step subsequent to that shown by FIG. 4.
Figure 9:
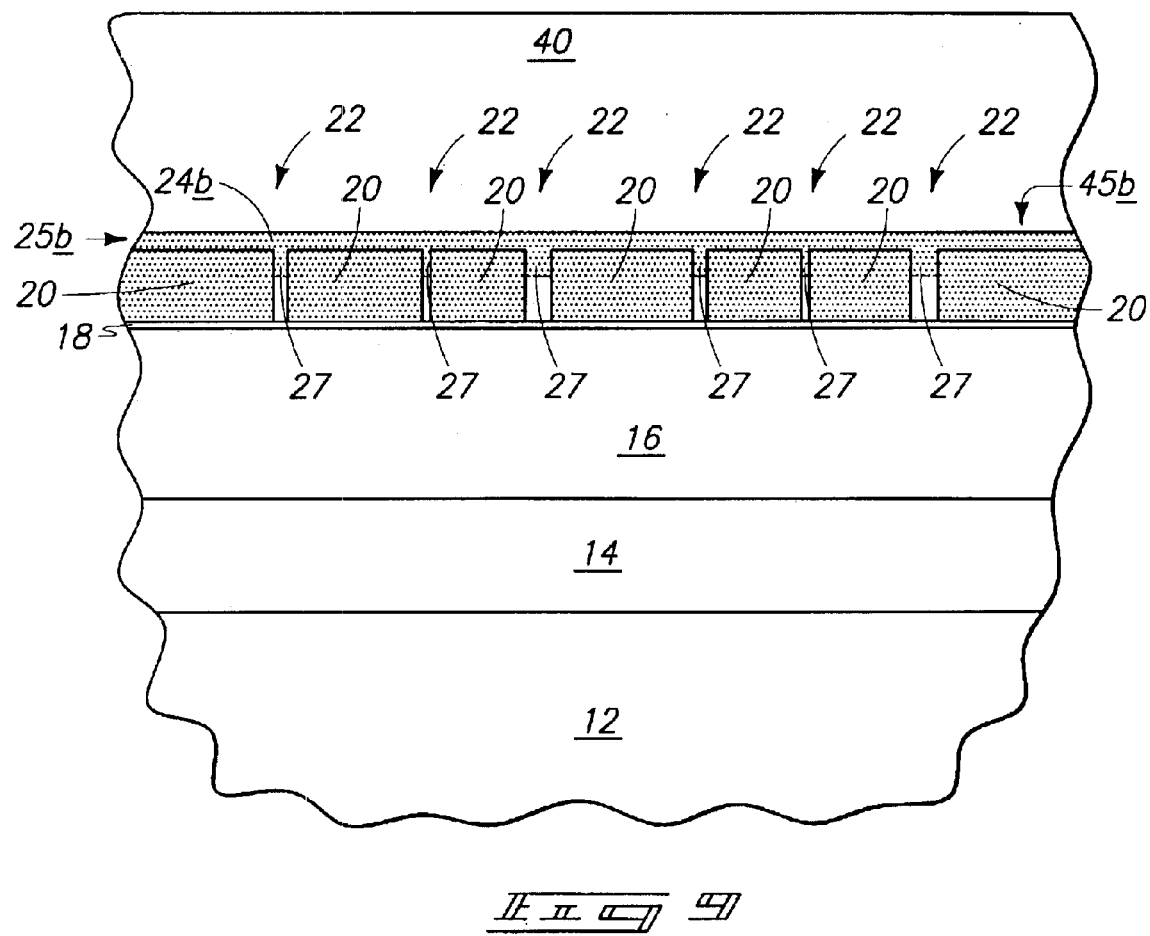
FIG. 9 is a view of the FIG. 5 wafer fragment at a processing step subsequent to that shown by FIG. 5.

Referring to FIGS. 7, 8 and 9, a second capacitor electrode 40 is formed over the substrate. In the preferred and illustrated embodiment, second capacitor electrode material 40 is formed on (in contact with) transformed layer 24/24a/24b. An exemplary thickness range for layer 40 is from 300 Angstroms to 600 Angstroms. Second electrode material 40 might comprise the same or different materials from first electrode material 16. In the depicted and preferred embodiment, layers 18, 20 and transformed layer 24/24a/24b constitute a respective capacitor dielectric region which is received intermediate the first and second capacitor electrodes. Most preferably in accordance with the preferred embodiment, the exposing of silicon oxide comprising layer 24 and the transformation to silicon nitride is effective to increase a dielectric constant of the dielectric region from what it was prior to the exposing.

The invention also comprises capacitors independent of the method of fabrication. For example, FIGS. 7, 8 and 9 depict capacitor dielectric regions 18/20/24, 18/20/24a and 18/20/24b. Each comprises a silicon nitride comprising layer 20/24, 20/24a and 20/24b, respectively, having outermost surfaces 45, 45a and 45b, respectively. Surfaces 45, 45a and 45b contact the respective second capacitor electrodes 40. Outermost surfaces 45/45a/45b consist essentially of silicon nitride. Silicon nitride comprising layers 20/24, 20/24a and 20/24b have a plurality of pinholes 22 therein which are at least partially filled with silicon oxide comprising material which is spaced from second electrode material 40. In the embodiments of FIGS. 7 and 8, such provide examples wherein the pinholes are totally filled with silicon oxide material. The embodiment of FIG. 9 depicts but one example wherein the pinholes are only partially filled with silicon oxide material, and in such depicted and preferred embodiment where the pinholes comprise uppermost portions which are filled with silicon nitride material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor comprising:

a first capacitor electrode;

a second capacitor electrode; and a capacitor dielectric region received intermediate the first and second capacitor electrodes, the capacitor dielectric region comprising a silicon nitride comprising layer having an outermost surface which contacts the second capacitor electrode, said outermost surface consisting essentially of silicon nitride, the silicon nitride comprising layer having a plurality of pinholes therein which are at least partially filled with silicon oxide which is free of silicon nitride and is spaced from the second electrode.

2. The capacitor of claim 1 wherein the pinholes are totally filled with silicon oxide.

3. The capacitor of claim 1 wherein the pinholes are only partially filled with silicon oxide.

4. The capacitor of claim 1 wherein the pinholes comprise uppermost portions filled with silicon nitride material.

5. The capacitor of claim 1 wherein the dielectric region comprises an inner silicon oxide comprising layer received intermediate the first capacitor electrode and the silicon nitride comprising layer.

6. A capacitor comprising:

a first capacitor electrode;

a second capacitor electrode; and a capacitor dielectric region received intermediate the first and second capacitor electrodes, the capacitor dielectric region comprising:

a silicon oxide comprising layer received on the first capacitor electrode; and a silicon nitride comprising layer received on the silicon oxide comprising layer, the silicon nitride comprising layer having an outermost surface which contacts the second capacitor electrode, said outermost surface consisting essentially of silicon nitride, the silicon nitride comprising layer having a plurality of pinholes therein which are at least partially filled with silicon oxide which is free of silicon nitride and is spaced from the second electrode.

7. The capacitor of claim 6 wherein the pinholes are totally filled with silicon oxide.

8. The capacitor of claim 6 wherein the pinholes are only partially filled with silicon oxide.

9. The capacitor of claim 6 wherein the pinholes comprise uppermost portions filled with silicon nitride material.

* * * * *